United States Patent
Gabor et al.

(10) Patent No.: US 7,650,273 B2
(45) Date of Patent: Jan. 19, 2010

(54) PERFORMANCE SIMULATION OF MULTIPROCESSOR SYSTEMS

(75) Inventors: Ron Gabor, Raanana (IL); Nathaniel Leibowitz, Tel Aviv (IL); Meir Tsadik, Hod Hasharon (IL); Yoram Kulbak, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/231,619

(22) Filed: Sep. 21, 2005

(65) Prior Publication Data

US 2007/0078640 A1 Apr. 5, 2007

(51) Int. Cl.
*G06F 9/44* (2006.01)

(52) U.S. Cl. .................................................. 703/21
(58) Field of Classification Search ............. 712/20, 712/32; 703/21
See application file for complete search history.

(56) References Cited

U.S. PATENT DOCUMENTS

| | | | |
|---|---|---|---|
| 6,052,524 A * | 4/2000 | Pauna ............................ | 703/22 |
| 7,072,825 B2 * | 7/2006 | Wang et al. ................... | 703/28 |
| 7,133,820 B2 * | 11/2006 | Pennello et al. .............. | 703/22 |
| 2006/0168571 A1 | 7/2006 | Ghiasi et al. | |

OTHER PUBLICATIONS

Author: Rakesh Kumar, Dean M. Tullsen, Parthasarathy Ranganathan, Norman P. Jouppi, Keith I. Farkas; Title: Single-ISA Heterogeneous Multi-Core Architectures for Multithreaded Workload Performance; Date: Jun. 2004; ISSN: 1063-6897.*
Author: Christian Ricci; Title: Simultaneous Multithreading (SMT) in Theory and Practice; Date: Mar. 29, 2004; Location of Paper: http://www.princeton.edu/~jdonald/research/hyperthreading/ricci_finalProject5593.pdf.*
Author: Rakesh Kumar, Dean M. Tullsen, Parthasarathy Ranganathan, Norman P. Jouppi, Keith I. Farkas; Title: Single-ISA Heterogeneous Multi-Core Architectures: The Potential for Processor Power Reduction; Date: Dec. 2003; ISBN: 0-7695-2043-X.*
Author: Ed Grochowski, Ronny Ronen, John Shen, Hong Wang; Title: Best of Both Latency and Throughput; Date: Oct. 2004; ISSN: 1063-6404.*

(Continued)

*Primary Examiner*—Paul L Rodriguez
*Assistant Examiner*—Russ Guill
(74) *Attorney, Agent, or Firm*—Blakely, Sokoloff, Taylor & Zafman LLP

(57) ABSTRACT

An embodiment of the present invention is a technique to simulate performance of a multi-core system. A micro-architecture effect is estimated from each core in the multi-core system. A model of a memory hierarchy associated with each core is simulated. The simulated model of the memory hierarchy is superpositioned on the estimated micro-architecture effect to produce a performance figure for the multi-core system.

29 Claims, 6 Drawing Sheets

OTHER PUBLICATIONS

Lawrence Yang et al., "System design methodology of UltraSPARC-I", 1995, 32nd ACM/IEEE Design Automation Conference, six unnumbered pages.*

Roland E. Wunderlich et al., "SMARTS: Accelerating microarchitectural simulation via rigorous statistical sampling", Jun. 2003, 30th Annual International Symposium on Computer Architecture 2003, twelve unnumbered pages.*

Olukotun, Kunle, et al., "Rationale, Design and Performance of the Hydra Multiprocessor", Stanford CS Technical Report, No. CSL-TR-94-645, 1945, pp. 1-19.

Morioka, M., et al., "Design and Evaluation of the High Performance Multi-Processor Server". Computer Design: VLSI in Comp. and Proc., 1994. ICCD '94. Proceedings, IEEE Comp. Soc., Oct. 10, 1994, pp. 66-69.

Kumar, R., et al., "Interconnections in Multi-Core Architectures: Understanding Mechanism, Overheads and Scaling", Computer Architecture, 2005, IEEE Jun. 4, 2005, pp. 408-419.

Solihin, Yan, et al., "Scal-Tool: Pinpointing and Quantifying Scalability Bottlenecks in DSM Multiprocessors", ACM/IEEE 1999, pp. 1-13.

Krishnan, V., et al., "A Direct-Execution Framework for Fast and Accurate Simulation of Superscalar", IEEE Com. Soc., Oct. 12, 1998, pp. 286-293.

* cited by examiner

PERFORMANCE SIMULATION OF MULTIPROCESSOR SYSTEMS

BACKGROUND

1. Field of the Invention

Embodiments of the invention relate to the field of computer performance, and more specifically, to performance simulation.

2. Description of Related Art

Performance simulations on processor systems are useful to evaluate design alternatives. Complex architectures of modern microprocessors typically require extensive simulation or modeling to accurately characterize the system performance. In the area of multiple cores or multiprocessor systems, such a simulation has become a challenge due to the complexity caused by interactions between the multiple cores or processors and memory subsystem usage.

Existing techniques to simulate performance of multi-core or multi-processor systems have a number of drawbacks. Techniques focusing on accurately simulating the micro-architecture features are very slow. To reduce simulation time, there are techniques that use random sampling or characterization-based sampling. Although these techniques may be effective for single-threaded workloads simulation, they may not be efficient for multi-threaded or multi-core environments. Other techniques such as analytical models and reduced input sets require a formal proof or validation of each model, and therefore are not appropriate for large design space exploration. In addition, they may not be accurate.

BRIEF DESCRIPTION OF THE DRAWINGS

Embodiments of invention may best be understood by referring to the following description and accompanying drawings that are used to illustrate embodiments of the invention. In the drawings.

DESCRIPTION

Figure 1:
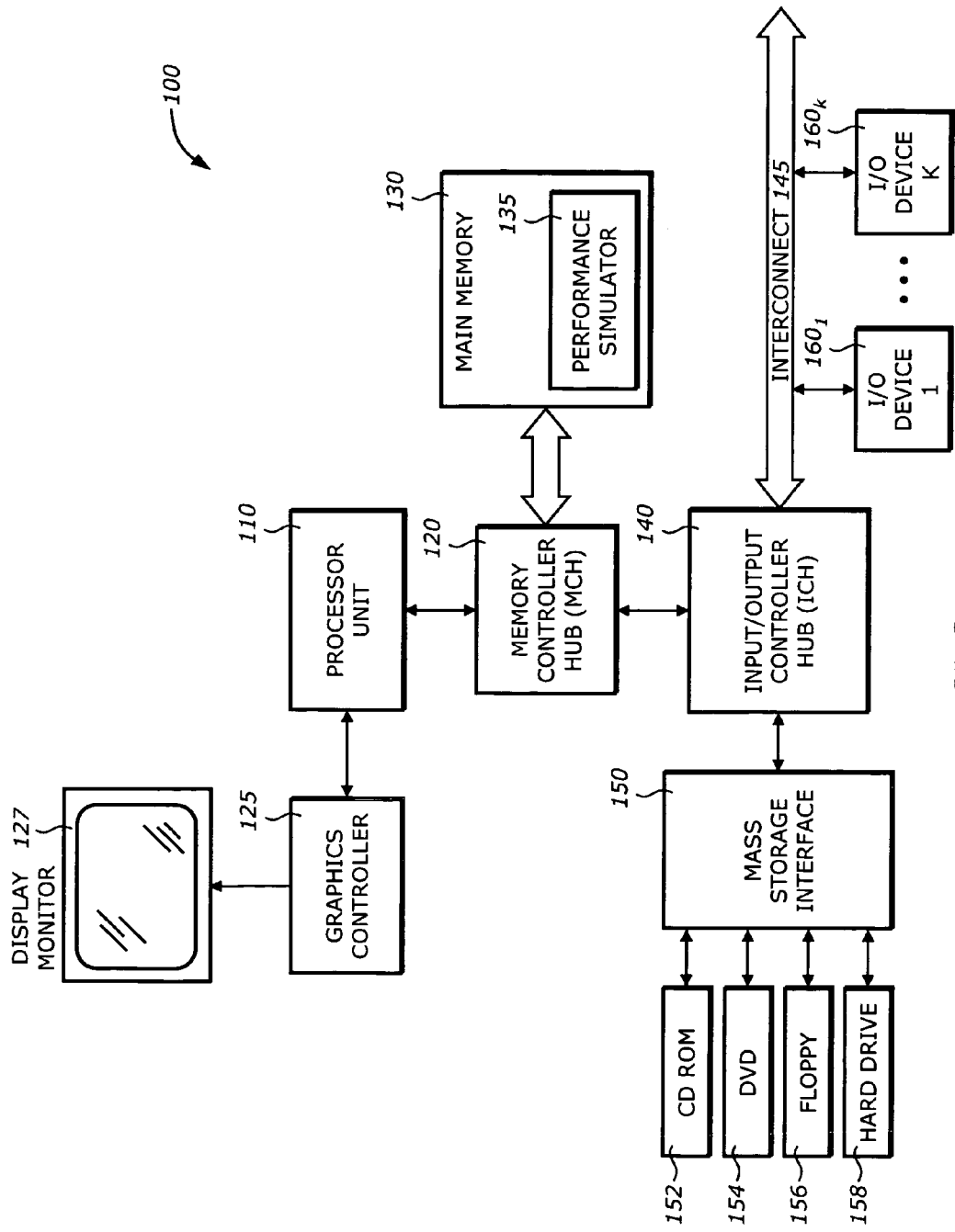
FIG. 1 is a diagram illustrating a system in which one embodiment of the invention can be practiced.

An embodiment of the present invention is a technique to simulate performance of a multi-core system. A micro-architecture effect is estimated from each core in the multi-core system. A model of a memory hierarchy associated with each core is simulated. The simulated model of the memory hierarchy is superpositioned on the estimated micro-architecture effect to produce a performance figure for the multi-core system.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to simulate the performance of a multi-core or multiprocessor system. The technique provides a tool for fast modeling of the performance of multi-threaded applications on symmetric or asymmetric clusters chip multi-processors. A slow micro-architecture simulation of a core is performed once on representative sections. This simulation is then used as a base on which simulations of various memory hierarchies are superpositioned. The result is an efficient method for exploring large design spaces by simulation. The technique also allows temporal separation of the micro-architecture simulation run from the memory-subsystem run. The simulation speed therefore increases, allowing simulation of massively-threaded processors' performance practical. In addition, by separating the models, the technique allows re-use of the core's micro-architectural performance simulation.

Elements of embodiments of the invention may be implemented by hardware, firmware, software or any combination thereof. The term hardware generally refers to an element having a physical structure such as electronic, electromagnetic, optical, electro-optical, mechanical, electromechanical parts, components, or devices, etc. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory). Examples of firmware may include microcode, writable control store, micro-programmed structure. When implemented in software or firmware, the elements of an embodiment of the present invention are essentially the code segments to perform the necessary tasks. The software/firmware may include the actual code to carry out the operations described in one embodiment of the invention, or code that emulates or simulates the operations. The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable or machine accessible medium include an electronic circuit, a semiconductor memory device, a read only memory (ROM), a flash memory, an erasable ROM (EROM), an erasable programmable ROM (EPROM), a floppy diskette, a compact disk (CD) ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include data that, when accessed by a machine, cause the machine to perform the operations described in the following. The machine accessible medium may also include program code embedded therein. The program code may include machine readable code to perform the operations described in the following. The term "data" here refers to any type of information that is encoded for machine-readable purposes. Therefore, it may include program, code, data, file, etc.

All or part of an embodiment of the invention may be implemented by hardware, software, or firmware, or any combination thereof. The hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

One embodiment of the invention may be described as a process, which is usually depicted as a flowchart, a flow diagram, a structure diagram, or a block diagram. Although a flowchart may describe the operations as a sequential process, many of the operations can be performed in parallel or concurrently. A loop or iterations in a flowchart may be described by a single iteration. It is understood that a loop index or loop indices or counter or counters are maintained to update the associated counters or pointers. In addition, the order of the operations may be re-arranged. A process terminates when its operations are completed. A process may correspond to a method, a program, a procedure, etc. A block diagram may contain blocks or modules that describe an element, an item, a component, a device, a unit, a subunit, a structure, a method, a process, a function, an operation, a functionality, or a task, etc. A functionality or an operation may be performed automatically or manually.

FIG. 1 is a diagram illustrating a processing system 100 in which one embodiment of the invention can be practiced. The system 100 includes a processor unit 110, a memory controller hub (MCH) 120, a graphics controller 125, a main memory 130, an input/output controller hub (ICH) 140, an interconnect 145, a mass storage interface 150, and input/output (I/O) devices $160_1$ to $160_K$.

The processor unit 110 represents a central processing unit of any type of architecture, such as processors using hyper threading, security, network, digital media technologies, single-core processors, multi-core processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture.

The MCH 120 provides control and configuration of memory and input/output devices such as the main memory 130 and the ICH 140. The MCH 120 may be integrated into a chipset that integrates multiple functionalities such as graphics, media, isolated execution mode, host-to-peripheral bus interface, memory control, power management, etc. The MCH 120 or the memory controller functionality in the MCH 120 may be integrated in the processor unit 110. In some embodiments, the memory controller, either internal or external to the processor unit 110, may work for all cores or processors in the processor unit 110. In other embodiments, it may include different portions that may work separately for different cores or processors in the processor unit 110.

The graphics controller 125 is any processor that has graphic capabilities to perform graphics operations such as fast line drawing, two-dimensional (2-D) and three-dimensional (3-D) graphic rendering functions, shading, anti-aliasing, polygon rendering, transparency effect, color space conversion, alpha-blending, chroma-keying, etc. It may include a specialized graphic engine that can perform specific and complex graphic functions such as geometry calculations, affine conversions, model view projections, 3-D clipping, etc. It may also processes displaying the graphic data on a display monitor 127 and performs display-related functions such as palette table look-up, synchronization, backlight controller, video processing, etc. The display monitor 127 is any display monitor that displays the graphic information on the screen for viewing. The display monitor 127 may be a Cathode Ray Tube (CRT) monitor, a television (TV) set, a Liquid Crystal Display (LCD), a Flat Panel, or a Digital CRT.

The main memory 130 stores system code and data. The main memory 130 is typically implemented with dynamic random access memory (DRAM), static random access memory (SRAM), or any other types of memories including those that do not need to be refreshed. The main memory 130 may include multiple channels of memory devices 25 such as DRAMs. The DRAMs may be Double Data Rate (DDR2). In particular, the memory 130 includes a performance simulator 135 to simulate the performance of a multi-core or multi-processor system.

The ICH 140 has a number of functionalities that are designed to support I/O functions. The ICH 140 may also be integrated into a chipset together or separate from the MCH 120 to perform I/O functions. The ICH 140 may include a number of interface and I/O functions such as peripheral component interconnect (PCI) bus interface, processor interface, interrupt controller, direct memory access (DMA) controller, power management logic, timer, system management bus (SMBus), universal serial bus (USB) interface, mass storage interface, low pin count (LPC) interface, etc.

The interconnect 145 provides interface to peripheral devices. The interconnect 145 may be point-to-point or connected to multiple devices. For clarity, not all the interconnects are shown. It is contemplated that the interconnect 145 may include any interconnect or bus such as Peripheral Component Interconnect (PCI), PCI Express, USB, and Direct Media Interface (DMI), etc.

The mass storage interface 150 provides an interface to a mass storage device that stores archive information such as code, programs, files, data, and applications. The mass storage device may include a compact disk (CD) read-only memory (ROM) 152, a digital video/versatile disc (DVD) 154, a floppy drive 156, and a hard drive 158, and any other magnetic or optic storage devices. The mass storage interface 150 provides a mechanism to read machine-accessible media. The I/O devices $160_1$ to $160_K$ may include any I/O devices to perform I/O functions. Examples of I/O devices $160_1$ to $160_K$ include controller for input devices (e.g., keyboard, mouse, trackball, pointing device), media card (e.g., audio, video, graphic), network card, and any other peripheral controllers.

Figure 2:
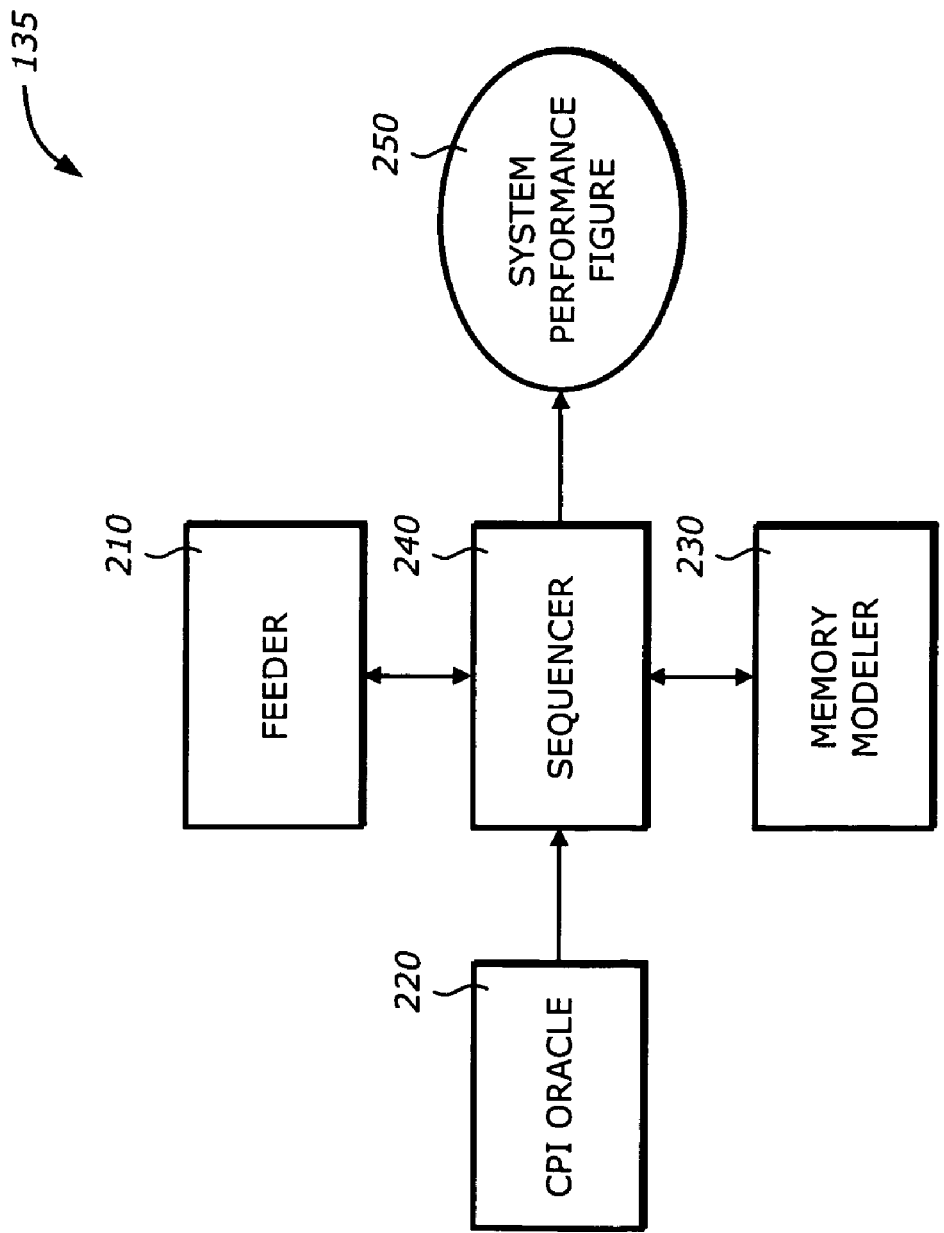
FIG. 2 is a diagram illustrating a performance simulator according to one embodiment of the invention.

FIG. 2 is a diagram illustrating the performance simulator 135 shown in FIG. 1 according to one embodiment of the invention. The performance simulator 135 includes a feeder 210, a cycle-per-instruction (CPI) oracle 220, a memory modeler 230, and a sequencer 240. The performance simulator 135 may include more or less components than the above.

The feeder 210 simulates the functional aspects (i.e., the architectural side) of the multi-core system. It feeds the sequencer 240 with instruction streams as they are being executed on the functional side. In essence, the sequencer 240 instructs the feeder 210 to run some number of instructions on one of the cores that is functionally simulated. The feeder 210 then executes this number of instructions, and provides the sequencer 240 with the dynamic instruction flow of the execution, along with the operands (e.g., memory addresses of load and store operations).

The CPI oracle 220 estimates the micro-architecture effect from each core in the multi-core system. The CPI related to the actual core architecture, excluding the memory subsystem, may be derived from this micro-architecture effect. The CPI oracle estimates the micro-architecture effect by computing a CPI measure using a performance simulation with perfect cache configuration. The perfect cache configuration includes memory accesses being serviced by a first level cache (e.g., L1 cache) with no accesses causing a miss. In other words, all memory-referencing instructions always result in a cache hit in the first level cache. In general, the motivation is to remove memory subsystem effects from the CPI measure. It should be noted that in some cases, an instruction may require memory accesses that never goes through the first level cache (e.g., uncacheable access), in which case, the simulation may use a zero-cycle memory subsystem latency. In a multi-core environment, the instruction ordering and composition may be affected by the specific memory hierarchy used for the execution. Due to synchronization between the cores, changes in the memory hierarchy parameters may alter the cores' synchronization points, hence the sequence of instructions. To minimize this effect, the CPI oracle 220 computes the micro-architecture CPI measure using a statistical approach. To do so, the CPI oracle 220 first groups the extended instruction pointers (EIP's) for the instructions into small groups. It then calculates an average CPI for each of the groups. It then uses the average CPI for an instruction belonging to the corresponding group as the CPI measure for the instruction.

The memory modeler 230 simulates a model of a memory hierarchy associated with each core. It simulates a detailed or simplified model with a functional core according to simulation criteria. The simulation criteria including speed and accuracy. The accuracy of simulation increases with the level of details, which also decreases the simulation speed. The memory modeler 230 computes a latency of the memory hierarchy including a cache miss at a cache level. All cache levels are considered including the second level cache (e.g., L2 cache) and the last level cache (e.g., L3 cache), if such last level cache exists.

The sequencer 240 superpositions the simulated model of the memory hierarchy on the estimated micro-architecture effect to produce a performance FIG. 250 for the multi-core system. It interacts with the feeder 210 to obtain the dynamic flow of the instructions as they are executed by the cores that are being simulated.

In summary, the performance simulator 135 retrieves an instruction flow from each simulated core, sequences the flow based on the CPI oracle 220 and the memory modeler 230 and produces the performance FIG. 250 of the complete application. It may simulate any code executed by any core, including operating system (OS) code, interrupt handlers, device drivers, etc.

Figure 3:
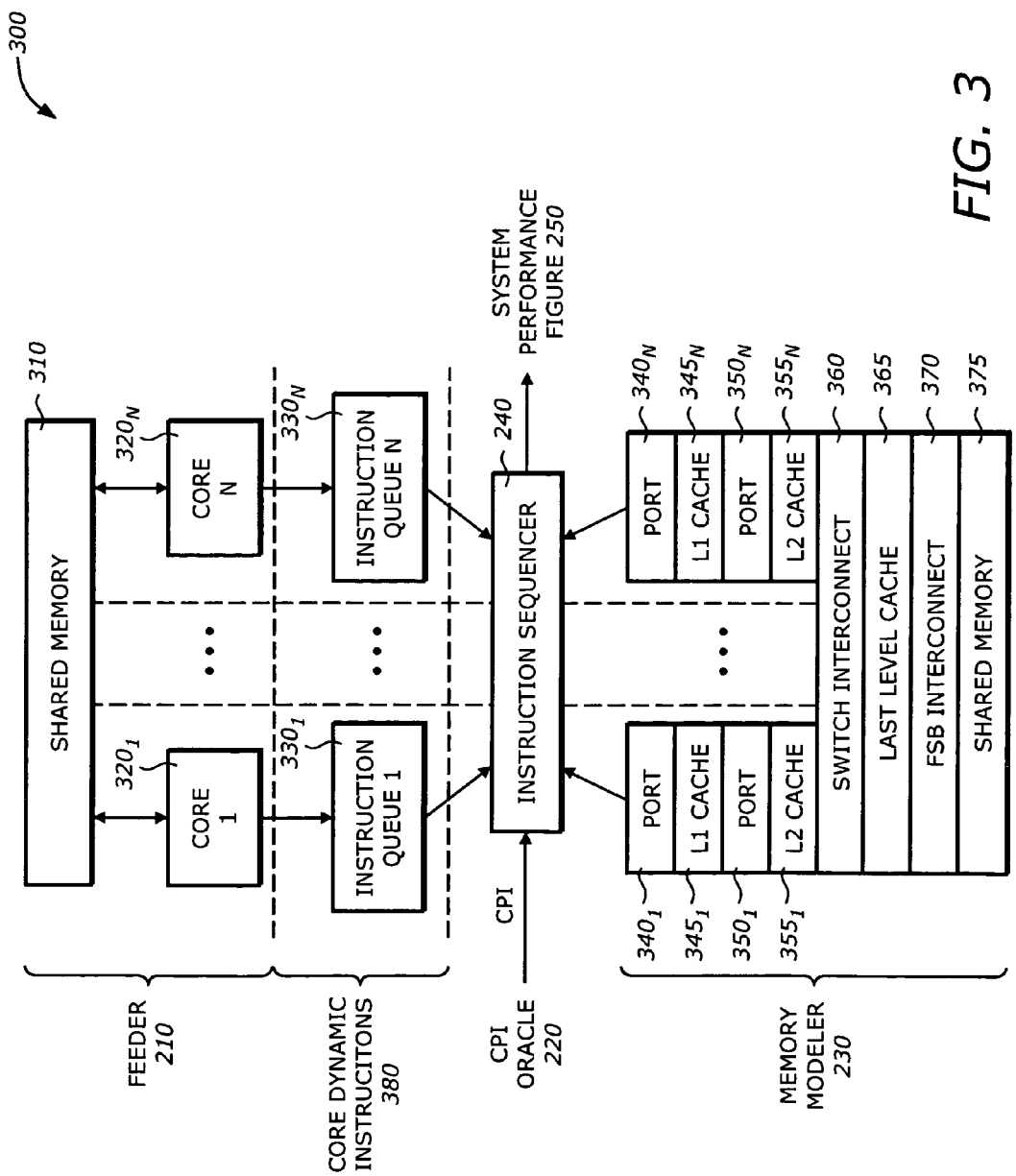
FIG. 3 is a diagram illustrating a simulated multi-core system according to one embodiment of the invention.

FIG. 3 is a diagram illustrating a simulated multi-core system 300 according to one embodiment of the invention. The simulated multi-core system 300 includes a shared memory 310, N cores $320_1$ to $320_N$ where N is any positive integer, N instruction queues $330_1$ to $330_N$, the instruction sequencer 240, N first level ports $340_1$ to $340_N$, N L1 cache $345_1$ to $345_N$, N second level ports $350_1$ to $350_N$, N L2 cache $355_1$ to $355_N$, a switch interconnect model 360, a last level cache model 365, a front side bus (FSB) interconnect model 370, and a shared memory model 375.

The shared memory 310 is an architectural memory that is common to all the N cores $320_1$ to $320_N$ in the system. The N cores $320_1$ to $320_N$ are modeled with their architectural state. The shared memory 310 and the N cores $320_1$ to $320_N$ are functionally simulated by the feeder 210 as described in FIG. 2.

Each of the instruction queues $330_1$ to $330_N$ contains a sequence of instructions that are executed during program execution. Each of the N instruction queues $330_1$ to $330_N$ is associated with a corresponding core in the N cores $320_1$ to $320_N$. The N instruction queues $330_1$ to $330_N$ may be modeled functionally as part of the feeder 210 and performance-wise as part of the sequencer 240. They may be referred to as core dynamic instruction 380.

The sequencer 240 obtains an instruction from one of the N instruction queues $330_1$ to $330_N$ to simulate. It selects an instruction queue associated with a core according to predefined criteria. The criteria may be an optimal criteria. For example, the instruction queue is associated with a core having a current number of queue cycles that is minimum among multiple cores or similar criteria for a cycle-by-cycle simulation. It then retrieves an instruction from the selected instruction queue, simulates the instruction, and updates the current number of queue cycles for the instruction queue. It updates the current number of queue cycles by adding the CPI measure and the function of the latency, if the instruction is memory-related, to the current number of queue cycles. The function of the memory latency depends on the core micro-architecture. The simplest function would be the latency itself (f(latency)=latency), which corresponds to a simple in-order single issue machine. However, on a more sophisticated micro-architectures (e.g., superscalar, out-of-order, VLIW) other functions may be required. The function determines how many cycles a certain memory latency operation incurs on the core itself. This may be an amount of blocking that a certain latency causes to the core. In some situations, this function may require additional arguments beside the latency (e.g., distribution of loads). The function may be determined from experiments, such as using principal component analysis on a large number of workloads, and may not depend on the workload but only on the micro-architecture. Any dependence on the workload may be switched into additional dynamic arguments to the function.

Let $C_k$ be the total number of cycles executed by the core k (referred to as queue cycles in the previous paragraph), where k=1 to N (N is the number of cores in the system). On each iteration, the instruction sequencer 240 determines j for which $C_j$ is minimum over all the $C_k$'S. It then selects an instruction from the selected instruction queue $C_j$ for simulation. Then, it updates $C_j$ by:

$$C_j=C_j+CPI(j,ip)+\text{mem}(\text{instr}) \quad (1)$$

where CPI(j,ip) is the statistical CPI obtained for the EIP ip using the statistical approach described above. The mem(instr) is the latency associated with the execution of the instruction instr. If the instruction instr is not a memory-related instruction, the mem(instr) is zero. If the instruction instr is a memory-related instruction, the mem(instr) is the number of cycles that the instruction is stalled due to the memory hierarchy. In other words, for a memory-related instruction, mem (instr) is the overall latency caused by the modeled memory hierarchy, including any cache miss in any of the internal caches. It should be noted that this embodiment uses a simple in-order core as an example, hence, the mem(instr) is directly added to the cycle count. In more sophisticated micro-architectures, a function of the mem(instr) may be used, which may use additional arguments to determine the amount of blocking a certain latency (mem(instr)) incurs on the core as discussed above.

The memory modeler 230 simulates the N first level ports $340_1$ to $340_N$, the N L1 caches $345_1$ to $345_N$, the N second level ports $350_1$ to $350_N$, the N L2 caches $355_1$ to $355_N$, the switch interconnect model 360, the last level cache model 365, the front side bus (FSB) interconnect model 370, and the shared memory model 375. Each of the N first level ports $340_1$ to $340_N$ and N second level ports $350_1$ to $350_N$ may have contention due to multiple accesses. It allows only a fixed number of transactions to go through at any cycle. When there are too many requests, some requests may have to be stalled. The performance model of each of the N L1 caches $345_1$ to $345_N$, the N second level ports $350_1$ to $350_N$, the N L2 caches $355_1$ to $355_N$ provides a latency for each request that reaches it. For example, when a read or write request is sent to a cache, its block is looked up. If found, the resulting latency is the hit latency which may include the cache access time. If not found, the resulting latency is the miss latency plus the cost or latency of looking up in the next cache level. On each access, all internal structures of the cache are updated according to the transaction. For example, the Least Recently Used (LRU) bits are updated for cache replacement. The contents (e.g., the addresses) are updated for misses to reflect the new data being cached. The switch interconnect model 360 simulates contention and delay caused by the switch that connects all the L2 caches to the single last level cache. It provides the latency for each request to get from the requester (e.g., the L2 cache) to the destination (e.g., the last level cache). The last level cache model 365 models a last level cache shared by all the cores. It models in a similar manner as the L1 and L2 cache. The FSB interconnect model 370 models the connection between the last level cache and the shared memory. It simulates the contention and delay and provides the latency for each request to get from the requester (e.g., the last level cache) to the destination (e.g., the memory). The shared memory model 375 models the architectural shared memory 310. It simulates access time (e.g., a fixed latency of 100 ns).

Figure 4:
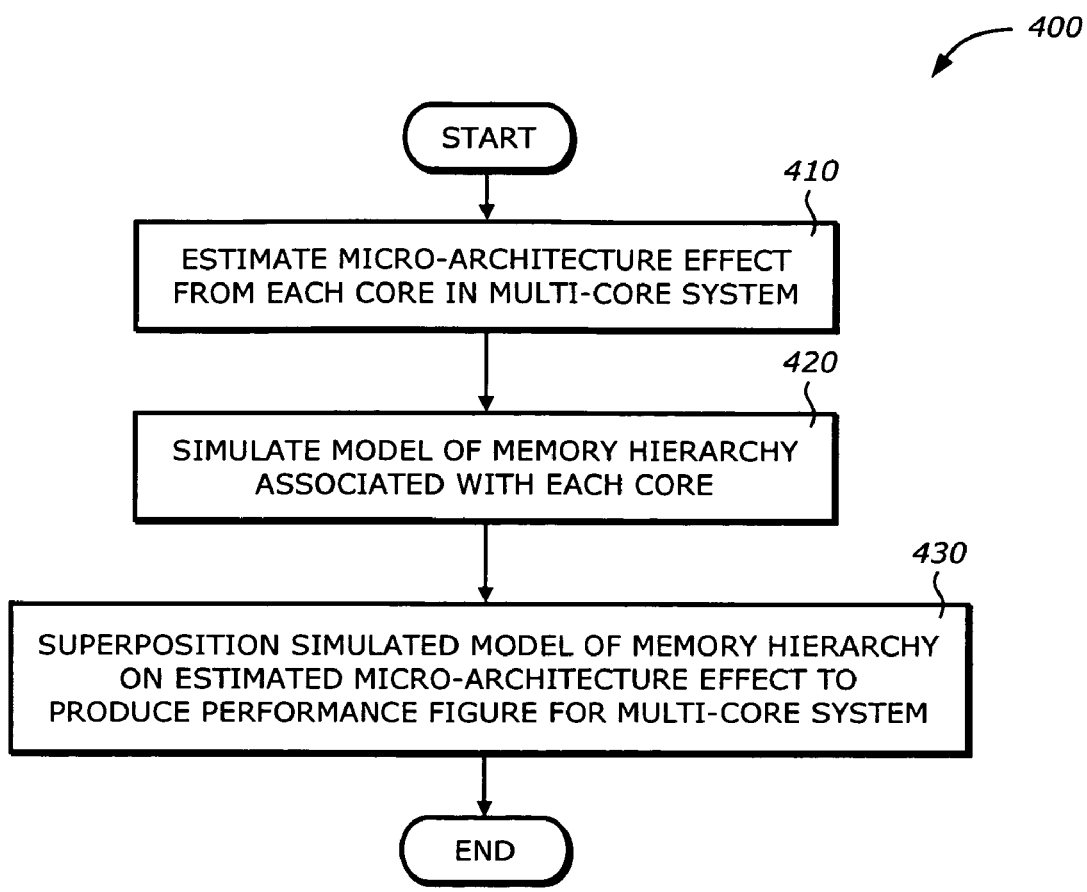
FIG. 4 is a flowchart illustrating a process to simulate performance of a multi-core system according to one embodiment of the invention.

FIG. 4 is a flowchart illustrating a process 400 to simulate performance of a multi-core system according to one embodiment of the invention.

Upon START, the process 400 estimates the micro-architecture effect from each core in a multi-core system (Block 410). Then, the process 400 simulates a model of a memory hierarchy associated with each core (Block 420). Next, the process 400 superpositions the simulated model of the memory hierarchy on the estimated micro-architecture effect to produce a performance figure for the multi-core system (Block 430) and is then terminated.

Figure 5:
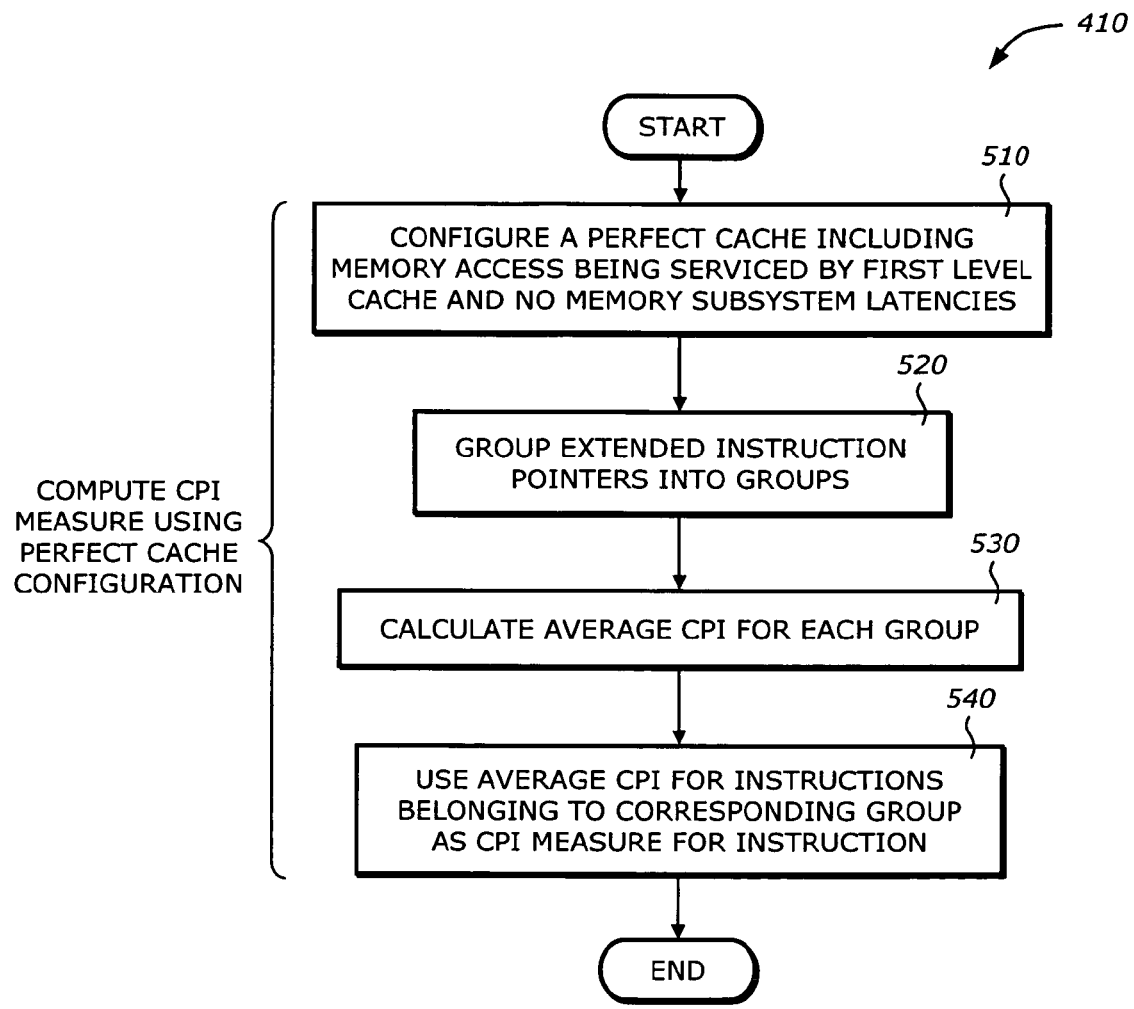
FIG. 5 is a flowchart illustrating a process to estimate micro architecture effect from each core according to one embodiment of the invention.

FIG. 5 is a flowchart illustrating the process 410 to estimate micro architecture effect from each core according to one embodiment of the invention. The process 410 estimates the micro-architecture by computing a CPI measure using a perfect cache configuration.

Upon START, the process 410 configures a perfect cache, in which all memory accesses are serviced by a first level cache as if they hit in that first level (Block 510). Then, the process 410 groups extended instruction pointers (EIP's) into groups (Block 520). Next, the process 410 calculates an average CPI for each of the groups (Block 530). Then, the process 410 uses the average CPI for an instruction belonging to the corresponding group as the CPI measure for the instruction (Block 540) and is then terminated.

Figure 6:
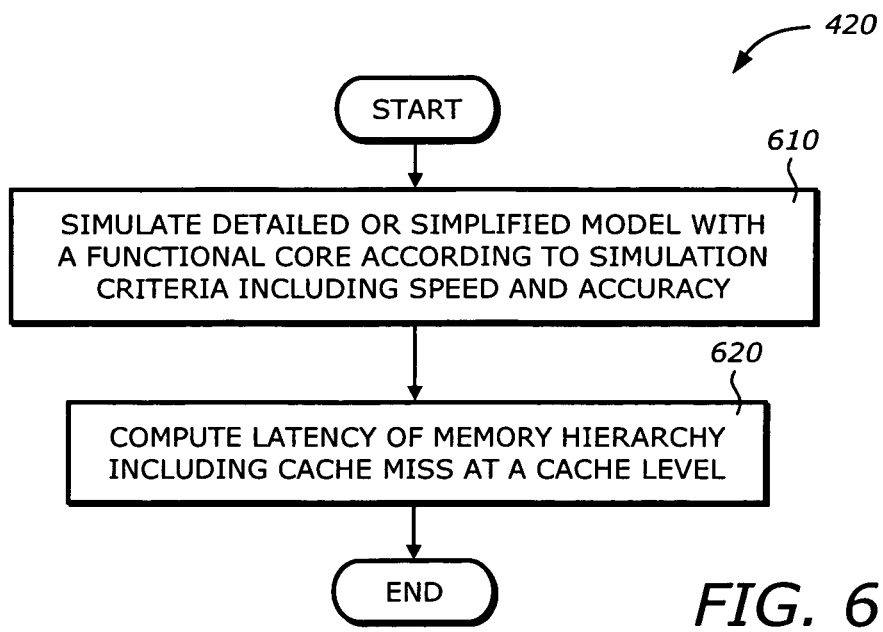
FIG. 6 is a flowchart illustrating a process to simulate a model of a memory hierarchy according to one embodiment of the invention.

FIG. 6 is a flowchart illustrating the process 420 to simulate a model of a memory hierarchy according to one embodiment of the invention.

Upon START, the process 420 simulates a detailed or simplified model with a functional core according to simulation criteria (Block 610). The simulation criteria include speed and accuracy. The process 420 performs this by computing a latency of the memory hierarchy including a cache miss at a cache level (Block 620). The process 420 is then terminated.

Figure 7:
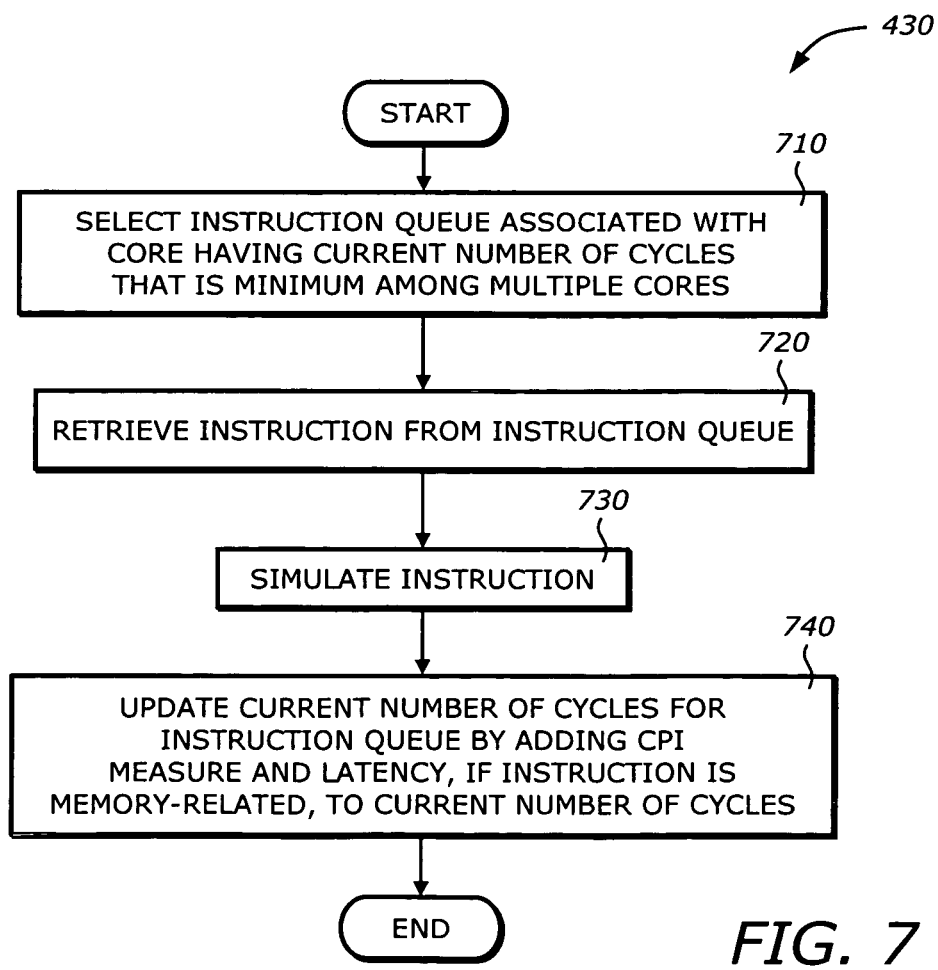
FIG. 7 is a flowchart illustrating a process to superposition according to one embodiment of the invention.

FIG. 7 is a flowchart illustrating the process 430 to superposition according to one embodiment of the invention.

Upon START, the process 430 selects an instruction queue associated with a core according to pre-defined criteria (Block 710). The criteria may be that the instruction queue has a current number of cycles that is minimum among multiple cores or similar criteria for a cycle-by-cycle simulation. Next, the process 430 retrieves an instruction from the instruction queue (Block 720). Then, the process 430 simulates the instruction (Block 730). Next, the process 430 updates the current number of cycles associated with the selected core (Block 740). This may be performed by adding the CPI measure and a function of the latency, if the instruction is memory-related, to the current number of cycles. The function is micro-architecture dependent, and is used to determine the number of cycles the core is stalled on account of memory access latency. The process 430 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    estimating micro-architecture effect from each core in a multi-core system, the micro-architecture effect providing derivation of a cycle per instruction (CPI) related to an actual core architecture excluding memory sub-system;
    simulating a model of a memory hierarchy associated with each core; and
    superpositioning the simulated model of the memory hierarchy on the estimated micro-architecture effect to produce a performance figure for the multi-core system.

2. The method of claim 1 wherein estimating the micro-architecture effect comprises:
    computing a CPI measure using a perfect cache configuration, the perfect cache configuration including memory accesses being serviced by a first level cache with no misses.

3. The method of claim 2 wherein computing the CPI measure comprises:
grouping extended instruction pointers (EIP's) into groups;
calculating an average CPI for each of the groups; and
using the average CPI for an instruction belonging to the corresponding group as the CPI measure for the instruction.

4. The method of claim 2 wherein simulating the model comprises:
simulating a detailed or simplified model with a functional core according to simulation criteria, the simulation criteria including speed and accuracy.

5. The method of claim 4 wherein simulating the detailed or simplified model comprises:
computing a latency of the memory hierarchy including a cache miss at a cache level.

6. The method of claim 5 wherein superpositioning comprises:
selecting an instruction queue associated with a core according to pre-defined criteria;
retrieving an instruction from the instruction queue;
simulating the instruction; and
updating the current number of cycles associated with the core.

7. The method of claim 6 wherein updating the current number of cycles comprises:
adding the CPI measure and a function of the latency, if the instruction is memory-related, to the current number of cycles.

8. The method of claim 5 wherein the cache level includes one of the first level cache, a second level cache, and a third level cache.

9. The method of claim 1 further comprising:
simulating functional aspects of the multi-core system.

10. The method of claim 9 wherein simulating the functional aspects comprises:
executing a number of instructions on one of cores of the multi-core system that is functionally simulated; and
providing dynamic instruction flow of executed instructions along with operands.

11. An article of manufacture comprising:
a machine-accessible storage medium including instructions that, when accessed by a machine, cause the machine to perform operations comprising:
estimating micro-architecture effect from each core in a multi-core system, the micro-architecture effect providing derivation of a cycle per instruction (CPI) related to an actual core architecture excluding memory subsystem;
simulating a model of a memory hierarchy associated with each core; and
superpositioning the simulated model of the memory hierarchy on the estimated micro-architecture effect to produce a performance figure for the multi-core system.

12. The article of manufacture of claim 11 wherein the instructions causing the machine to perform estimating the micro-architecture effect comprise instructions that, when accessed by the machine, cause the machine to perform operations comprising:
computing a CPI measure related to each core using a perfect cache configuration, the perfect cache configuration including memory accesses being serviced by a first level cache with no misses.

13. The article of manufacture of claim 12 wherein the instructions causing the machine to perform computing the CPI measure comprise instructions that, when accessed by the machine, cause the machine to perform operations comprising:
grouping extended instruction pointers (EIP's) into groups;
calculating an average CPI for each of the groups; and
using the average CPI for an instruction belonging to the corresponding group as the CPI measure for the instruction.

14. The article of manufacture of claim 13 wherein the instructions causing the machine to perform simulating the model comprise instructions that, when accessed by the machine, cause the machine to perform operations comprising:
simulating a detailed or simplified model with a functional core according to simulation criteria, the simulation criteria including speed and accuracy.

15. The article of manufacture of claim 14 wherein the instructions causing the machine to perform simulating the detailed or simplified model comprise instructions that, when accessed by the machine, cause the machine to perform operations comprising:
computing a latency of the memory hierarchy including a cache miss at a cache level.

16. The article of manufacture of claim 15 wherein the instructions causing the machine to perform superpositioning comprise instructions that, when accessed by the machine, cause the machine to perform operations comprising:
selecting an instruction queue associated with a core according to pre-defined criteria;
retrieving an instruction from the instruction queue;
simulating the instruction; and
updating the current number of cycles associated with the core.

17. The article of manufacture of claim 16 wherein the instructions causing the machine to perform updating the current number of cycles comprise instructions that, when accessed by the machine, cause the machine to perform operations comprising:
adding the CPI measure and a function of the latency, if the instruction is memory-related, to the current number of cycles.

18. The article of manufacture of claim 15 wherein the cache level includes one of the first level cache, a second level cache, and a third level cache.

19. The article of manufacture of claim 11 wherein the instructions further comprise instructions that, when accessed by the machine, cause the machine to perform operations comprising:
simulating functional aspects of the multi-core system.

20. The article of manufacture of claim 19 wherein the instructions causing the machine to perform simulating the functional aspects comprise instructions that, when accessed by the machine, cause the machine to perform operations comprising:
executing a number of instructions on one of cores of the multi-core system that is functionally simulated; and
providing dynamic instruction flow of executed instructions along with operands.

21. A system comprising:
a processor; and
a memory containing a performance simulator executed by the processor, the performance simulator comprising:
a cycle-per-instruction (CPI) oracle to estimate micro-architecture effect from each core in a multi-core system, the micro-architecture effect providing derivation of a CPI related to an actual core architecture excluding memory subsystem, a memory modeler to simulate a model of a memory hierarchy associated with each core, and a sequencer coupled to the CPI oracle and the memory modeler to superposition the simulated model of the memory hierarchy on the estimated micro-architecture effect to produce a performance figure for the multi-core system.

22. The system of claim 21 wherein the CPI oracle computes a CPI measure associated with each core using a perfect cache configuration, the perfect cache configuration including memory accesses being serviced by a first level cache with no misses.

23. The system of claim 22 wherein the CPI oracle computes a CPI measure by grouping extended instruction pointers (EIP's) into groups, calculating an average CPI for each of the groups, and using the average CPI for an instruction belonging to the corresponding group as the CPI measure for the instruction.

24. The system of claim 23 wherein the memory modeler computes a latency of the memory hierarchy including a cache miss at a cache level.

25. The system of claim 24 wherein the cache level includes one of the first level cache, a second level cache, and a third level cache.

26. The system of claim 23 wherein the sequencer simulates an instruction retrieved from an instruction queue associated with a core and selected according to pre-defined criteria, the sequencer updating the current number of cycles associated with the core after the instruction is simulated.

27. The system of claim 26 wherein the sequencer updates the current number of cycles by adding the CPI measure and a function of the latency, if the instruction is memory-related, to the current number of cycles.

28. The system of claim 21 wherein the performance simulator further comprises:

a feeder coupled to the sequencer to simulate functional aspects of the multi-core system.

29. The system of claim 28 wherein the feeder executes a number of instructions on one of cores of the multi-core system that is functionally simulated, and provides dynamic instruction flow of executed instructions along with operands.

* * * * *